United States Patent [19]

Trissel

[11] Patent Number: 5,729,223
[45] Date of Patent: Mar. 17, 1998

[54] METHOD AND APPARATUS FOR DATA COMPRESSION AND RESTORATION

[75] Inventor: David W. Trissel, Austin, Tex.

[73] Assignee: Motorola Inc., Schaumburg, Ill.

[21] Appl. No.: 619,051

[22] Filed: Mar. 20, 1996

[51] Int. Cl.[6] .................................................. H03M 7/00
[52] U.S. Cl. .................................................... 341/51
[58] Field of Search ................................. 341/51, 59, 65, 341/82

[56] References Cited

U.S. PATENT DOCUMENTS

| 4,586,027 | 4/1986 | Tsukiyama et al. | 340/347 |
|---|---|---|---|
| 4,701,745 | 10/1987 | Waterworth | 340/347 |
| 4,872,009 | 10/1989 | Tsukiyama et al. | 341/95 |
| 4,906,991 | 3/1990 | Fiala et al. | 341/51 |
| 5,003,307 | 3/1991 | Whiting et al. | 341/51 |
| 5,016,009 | 5/1991 | Whiting et al. | 341/67 |
| 5,126,739 | 6/1992 | Whiting et al. | 341/106 |
| 5,532,694 | 7/1996 | Mayers et al. | 341/67 |
| 5,572,206 | 11/1996 | Miller et al. | 341/51 |

Primary Examiner—Brian K. Young
Attorney, Agent, or Firm—J. Gustav Larson

[57] ABSTRACT

An apparatus (900) for performing the steps of data compression and data expansion. Where the steps of compression of use a modulo arithmetic unit (915) for identifying matching blocks of data that are offset from each other by a multiple of N. A matching block of data is compressed by the apparatus (900) by replacing it with an escape sequence representing the size and offset of the matching block of data. The apparatus (900) identifies a least used data value for use as an escape character to identify the escape sequence. The apparatus (900) performs data expansion by identifying escape sequences and locating an expanded block of data that matches the data represented by the escape sequence by multiplying the offset represented in the escape character by N to specify the offset to the expanded block of data.

20 Claims, 7 Drawing Sheets

| ESCAPE CHARACTER | ESCAPE SEQUENCE | DESCRIPTION | |
|---|---|---|---|
| (E₁) | (E₁) | OFFSET 1 | SIZE 3 |
| (E₂) | (E₂) OOOOOSSS | OFFSET OOOOO | SIZE SSS |
| (E₃) | (E₃) O | OFFSET O | SIZE 3 |
| (E₄) | (E₄) OOSSS | OFFSET O | SIZE SSS |
| | O = 1 BIT OF OFFSET<br>S = 1 BIT OF SIZE | O→1 BYTE OFFSET<br>S→1 BYTE SIZE | |

METHOD AND APPARATUS FOR DATA COMPRESSION AND RESTORATION

FIELD OF THE INVENTION

This invention relates generally to the compression and restoration of data.

BACKGROUND OF THE INVENTION

Data compression techniques have long been used in industry to optimize storage resources such as hard drives, magnetic tapes, and magnetic diskettes. There are numerous data compression techniques known and used in industry today. One common data compression technique is a windowing scheme. Windowing schemes maintain a "window" of data to be searched for duplicate data blocks. The use of such a scheme relies upon the well established fact that blocks of data are often repeated within a given data file. As illustrated in prior art FIG. 1, uncompressed data file 102 contains a first occurrence of a data block 104 containing the values E, F, G, and H. A second data block containing the sequence E, F, G, and H is represented by data block 106. Through the use of a windowing scheme, the data values to the left of data block 106 would constitute a "window" of data to be searched for a match. When a match between data blocks 104 and 106 is identified, the repeating sequence 106 is compressed to the compressed data file 108, as shown in FIG. 1. A way of compressing duplicate data, such as data block 106, is to replace the matching data by an escape sequence 110. The escape sequence 110 contains an escape character, an offset to the duplicate block 104, and the size of the duplicate block 104. The escape character identifies the beginning of the escape sequence and is represented by the symbol @ in the escape sequence 110. The offset to the duplicate block of data 104 is represented by the number 5 in escape sequence 110, and specifies an offset of 5 bytes to the duplicate data block. The size of the data block 104 is represented by the number 4 in the escape sequence 110 and represents a data block size of 4 bytes.

During data restoration, the compressed data file 108 is expanded to re-create the original data file 102. This restoration process, must identify escape characters, such as the @ in escape sequence 110, as they occur. Using the offset and length information in the escape sequence, the restoration recreates the original data file 102. The decompression routine must determine if an encountered escape character @ is part of an escape sequence 110 or if it represents the actual data value "@" 112. In order to correctly identify an escape character @ from a data byte having the same value "@", it is common for the compression routine to duplicate the escape character, @@, as shown in data block 114 to indicate that the character value "@" 112 should be used instead of an escape character @. The prior art technique described above has the disadvantages of a slow compression time and inefficient compressing based on the escape character choice.

The first disadvantage of the prior art is a slow compression time. The prior art technique incrementally evaluates each data element (element) against each element in the "window", which contains previously evaluated elements, looking for matching data blocks to replace with an escape sequence. For example in FIG. 1, if the current element were element J 116, the elements in data block 118 would be a "window" containing previously evaluated element which are represented in the compressed file 108. In order to evaluate a data block beginning at element J 116 for matches, the prior art would compare the element J 116 to each element in match area 118 looking for a match. When a match was found, adjacent elements would be compared to determine the match length before replacing the matching data block with an escape character. The prior art method of searching for matches by evaluating each element in the "window", or match block, causes the prior art compression to be slow, especially when the match area 118 is allowed to become large. Therefore, a compression routine that searches a subset of the elements in the match area 118, while still identifying most matching strings is advantageous.

The second disadvantage of prior art compression routines is the usage of escape characters. Because escape characters are truly data bytes, there will be instances where the original file contains data bytes equal to the escape characters (@ 112 for FIG. 1). When a data byte is encountered that is equal to an escape character, extra processing on compressed file space is used to represent the data byte.

BRIEF DESCRIPTION OF THE DRAWINGS

FIG. 1 represents the encoding of a string of sample text in accordance with the prior art;

FIG. 2 illustrates the encoding of a string of sample text in accordance with the present invention;

DETAILED DESCRIPTION OF A PREFERRED EMBODIMENT

The present invention relates to a method and apparatus of data compression and restoration. By using modulo arithmetic to perform a partial search of a "window", significant time saving to the compression process can be realized. Thus overcoming one disadvantage of the prior art. In addition, by pre-searching the data file to determine which data values are the least used, a more efficient compressed file is obtained. Hence overcoming a second objection to the prior art.

In accordance with the present invention, there is a pre-compression step of determining which data values are the least used, or unused, in the data file being compressed, these values are used as escape characters. Next, the data compression is accomplished by doing a partial search of data in a match area based on modulo arithmetic, where data is searched only at specific intervals relative to a current location. For example, every fourth data location in the match area, relative to the current location, could be compared to the current location. When a match occurs, a compression step is performed on the matching data by storing an escape sequence.

Figures 4, 5:
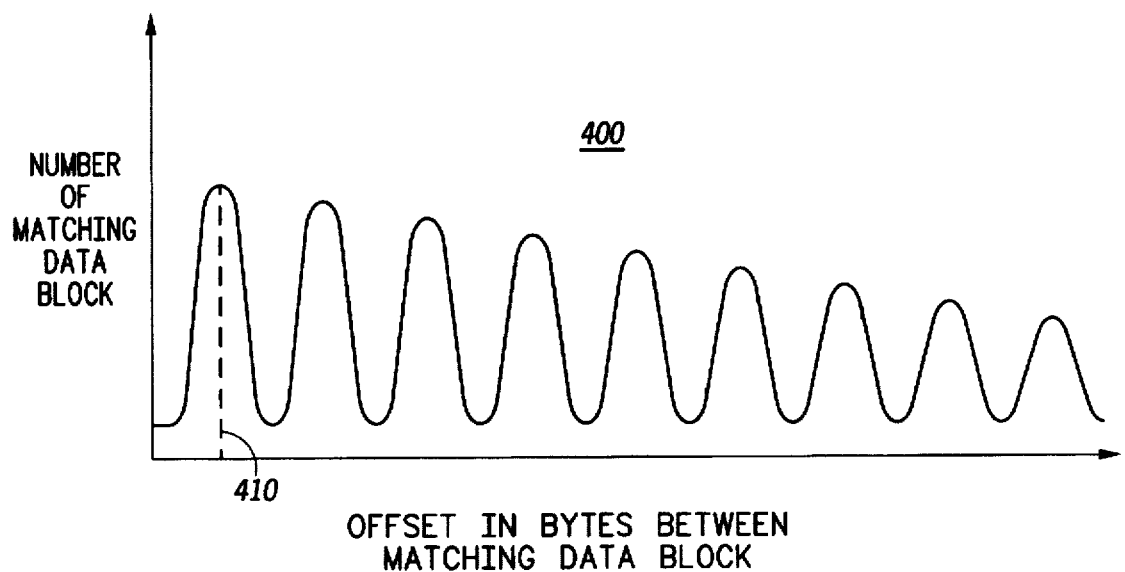
FIG. 4 illustrates a generalized distribution of data block matches by offset between matches.
FIG. 5 illustrates a list of escape character sequences and their description.

The prior art analyzes every byte in the match area against a byte stored at a current location, the present invention conducts a partial search of the match area by analyzing only a portion of the bytes in the match area before advancing the current location. By not analyzing every byte, the present invention takes advantage of a repetitive characteristic of data files. A common example of a data file having a repetitive characteristic is a data file that stores computer programs having multiple byte instructions. This repetitive characteristic is the result of data processors having a fixed instruction word sizes. For example, a 32 bit data processor would produce instructions having 32 bits. These instructions would generally be stored as bytes data with each instruction represented in 4 bytes. By indexing through the match area by a base offset of 4, using a modulo arithmetic unit, instead of by single bytes, the present invention takes advantage of the repetitive characteristics of data processor instructions. FIG. 4 generically represents a graph displaying the number of data block matches that occur at given offsets for a data file containing data processor instructions. The graph shows peaks occurring at repetitive intervals. For a 32 bit data processor, the peaks would be at 4 byte intervals. While there are matches at non-peak locations, they are significantly fewer.

While the present invention misses some matches that occur at non-integer multiple offsets of a base offset, it is apparent from the graph of FIG. 4 that a significant portion of matching blocks will be recognized due to the repetitive characteristic of computer instructions.

Figure 3:
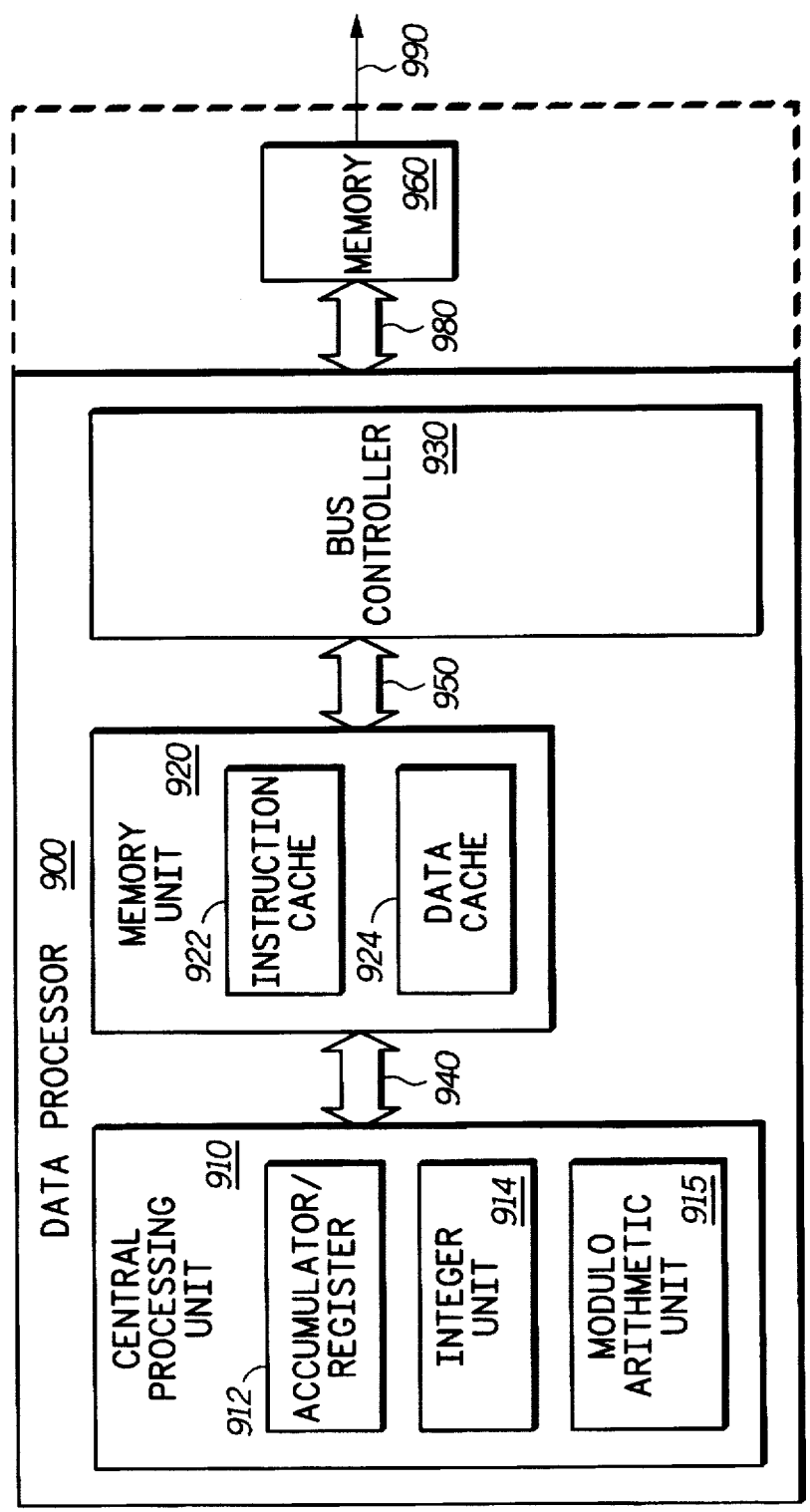
FIG. 3 illustrates a data processor system for compressing data.

FIG. 3 represents an apparatus 900 capable of implementing the compression and decompression methods described herein. The apparatus 900 comprises a central processor unit (CPU) 910, a memory unit 920, a bus controller 930, a bus 940 and a bus 950. The CPU 910 would contain an arithmetic logic units (ALU), which could be represented by the integer unit 914, an accumulator/register block 912, and modulo arithmetic unit (MAU) 915. The CPU 910 primary purpose is to execute computer type instructions. The execution unit 910 is coupled to the memory unit 920 through bus 940. Bus 940 can consist of multiple buses such as a data bus and an instruction bus, or it can be a single bus that is shared between instructions and data. Cache memory unit 920 is shown to further contain instruction cache 922 and data cache 924. The instruction cache 922 and data cache 924 are optional blocks in the data processor 900, as many data processors do not use instruction or data caches. The memory unit itself can be an optional block for some data processors that utilize external memory only. The memory unit 920 is connected to the bus 950, which can also consist of multiple buses such as a data bus and an instruction bus. The bus 950 is connected to the bus controller 930. The bus controller 930's responsibility would be to interface to non-cache memory 960 as requested by the execution unit or the memory unit. As such, the bus controller 930 is connected to the bus 980 which is shown to connect to memory 960. Memory 960 can be external memory such as a RAM, or a ROM, or an external storage media such as a tape drive or a floppy disk. In addition, memory 960 can be on board memory, which resides on the data processor 900. Memory 960 can also contain different types of memory. For example, memory 960 could represent memory which resides upon data processor 900, an external RAM, an external ROM, and an external hard drive for storing memory. An output node 990 is connected to the memory 960. This node represents the ability of the data processor to route data to an external data channel or routing device such as a modem, a serial link, or a parallel link. This can be accomplished by writing to a memory location on the data processor 900. Therefore, the node 990 is shown connected to the memory block 960. In this application storing to a memory could also include routing to a data signal. The intent of FIG. 3 is to provide a data processor configuration capable of implementing the present invention. The data processor of FIG. 3 is not meant to be a maximum, or minimum configuration for the present invention.

Figures 1, 2:
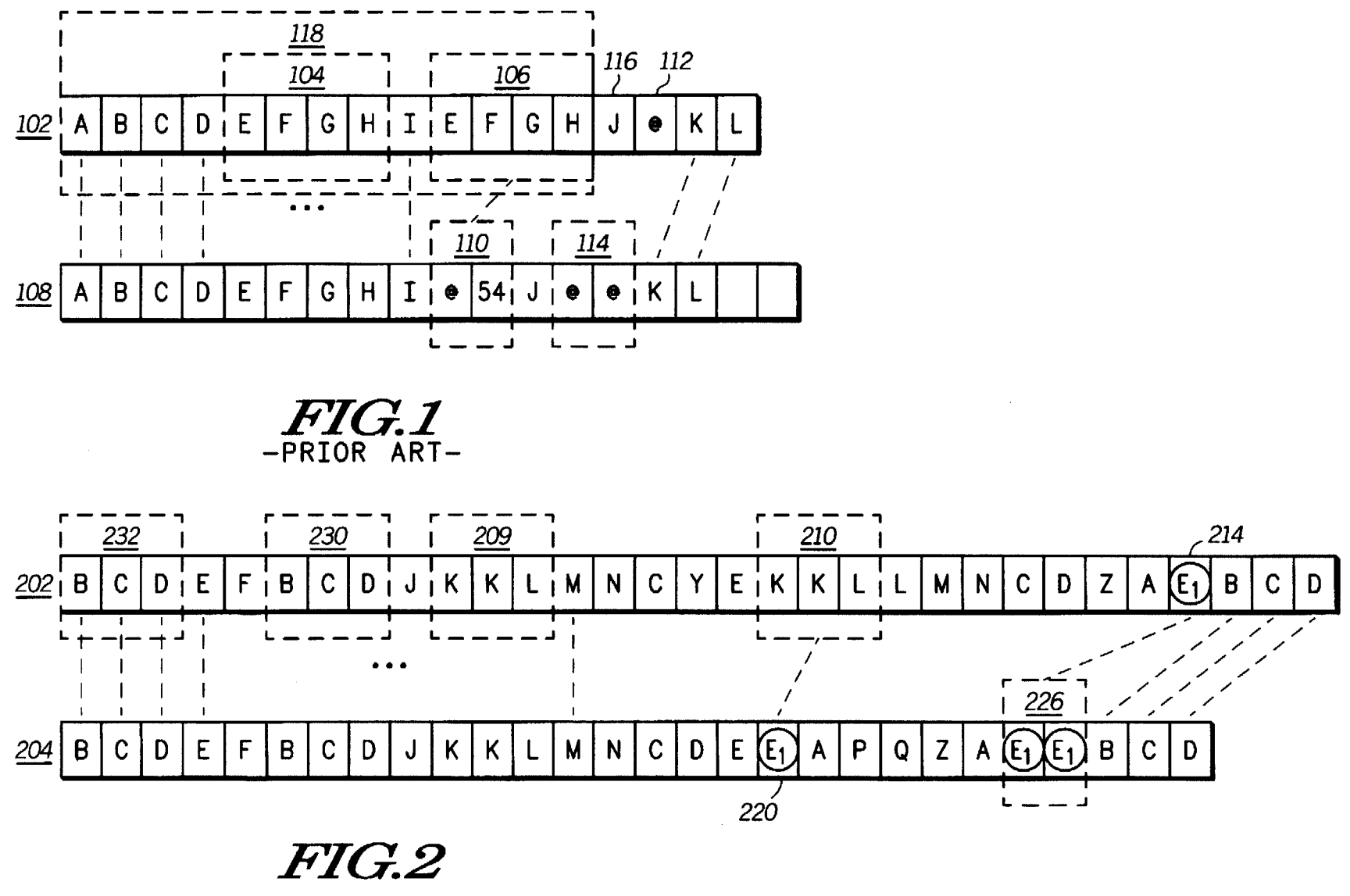

In accordance with the present invention, the uncompressed data file of FIG. 2, 202 would be received by the data processor 900, (FIG. 3). Once received, the data file 202 would be stored in a memory 960. The memory location at which the data file is stored could be by random access memory (RAM), a register, or a nonvolatile storage media such as a read only memory (ROM) tape, etc.

Once stored, the data processor 900 would execute a compression routine in accordance with the invention, to parse the file 202 looking for duplicate blocks of entries. This process of finding and searching for duplicate blocks of data is accomplished by starting at a current location in memory and using the modulo arithmetic unit 915 to search through a second location in memory where the values of the data 202 are already represented in the compressed file 204, and therefore, are currently known. This second area can be referred to as the match area.

Once a duplicate block is identified, the compression continues by using an escape sequence in place of the matching string. The escape sequence indicates the offset and match size to an original matching group of entries or blocks. FIG. 5 illustrates a number of possible escape sequences. The present invention uses modulo arithmetic to take advantage of the repetitive nature the data file by using an offset that is a factor of the actual offset, which when multiplied by N produces the actual offset in bytes. ((offset value stored)*(N)=actual offset in bytes). For example, for a 32 bit data processor N is equal 4, therefore, in order to represent a total offset of 8 bytes an integer of 2 would be stored as the offset. At a minimum, the escape sequence will contain an escape character, or escape value, which is recognized by the decompression program to have a fixed offset and size.

Another advantage of the present invention is a method of choosing least used escape characters. As presently discussed, if a data value ("@") is the same as an escape character value (@), the data value "@" is distinguished from the escape character @ by duplicating it (@ @), hence doubling the space needed to represent the actual data value "@" in memory. Therefore, in order to further reduce the size of compressed files, the present invention determines which data values, or byte values, for a given data file are the least used (including unused). By assigning the least used values as escape characters an efficiency is gained, since the compressed file will contain no more double escape characters than necessary.

Figure 6:
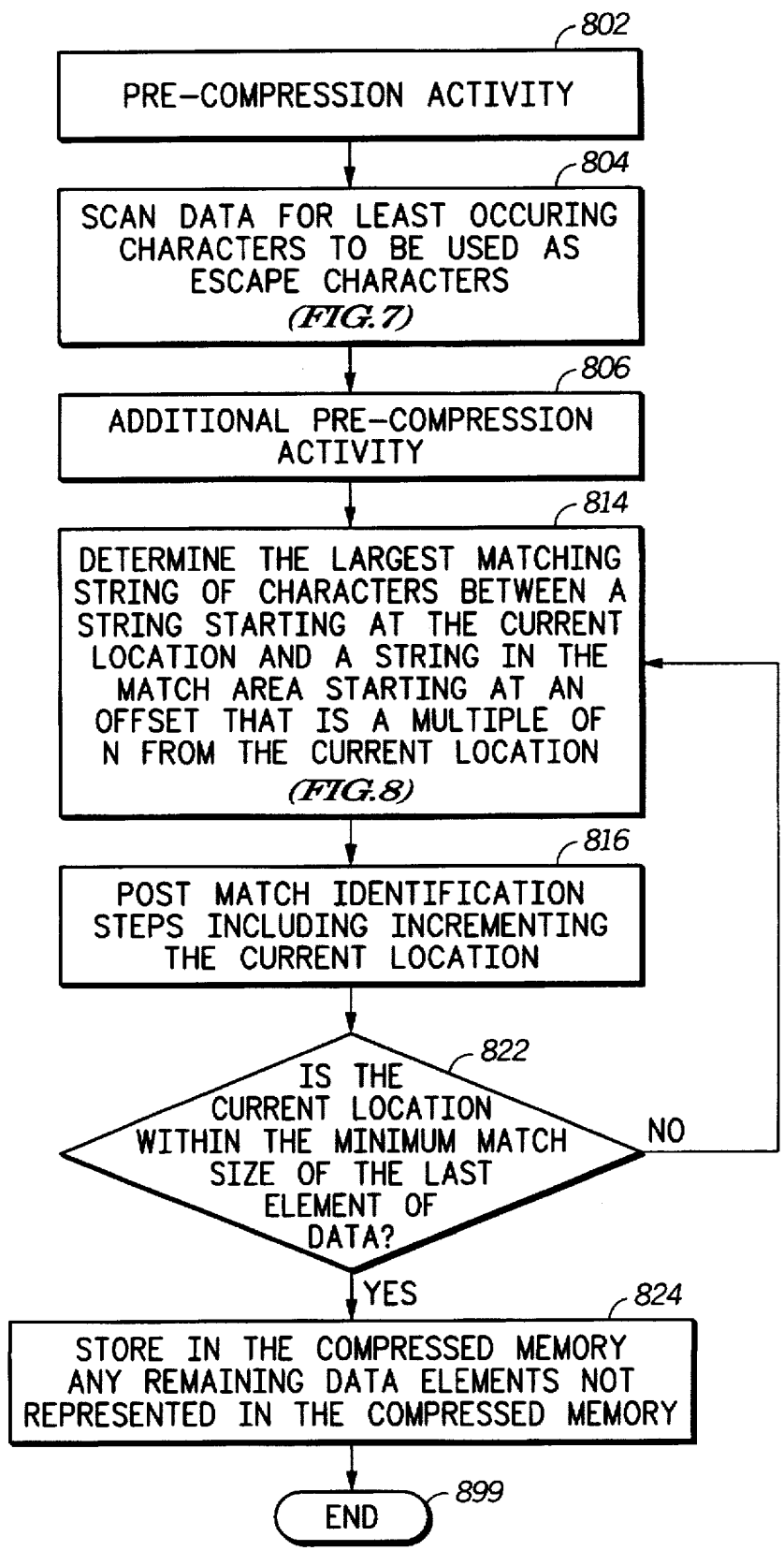
FIG. 6 illustrates a method of data compression.

FIG. 6 illustrates a flow chart representing the method used to implement the invention. A first step 802 (FIG. 6) is used to perform pre-processing steps. These steps would include, but not be limited to, loading data into a memory for processing. Note, it is not necessary for an entire data file to be received at the same time, as a partial data file may be operated on. Next, a step 804 is used to scan the data for least occurring characters to be used as escape characters. A detailed discussion with respect to step 804 will be discussed with respect to FIG. 7. Next, at step 806, initial compression steps are performed, this would include defining a setup table of escape sequences to be stored in compressed memory, defining a minimum match size M, defining a match area by storing at least M bytes of uncompressed data in a match area, and identifying a current location. In addition, a first entry and a last entry need to be identified such that all of the data to be compressed resides at or between the first entry location and the last entry location. Next, continuing at step 814 the location and size of the largest matching string of characters between the string starting at the current location (current group) and a string starting at a match location (match group) in the match area; where the match location begins at an offset N as a factor. The largest match between the current group of characters and the compare group of characters is determined by accessing each possible size for the compare group and the current group. By evaluating only those strings in the match area that start at an offset from the current location, having N as a factor, it is assured that the offset will be a multiple of the instruction length N. For example, a matching string 232 (FIG. 2) that begins 5 bytes from the string 230, where string 230 begins at the current location would not be identified as an appropriate match when N is equal 4, however, a matching string 209 that begins 8 bytes from the string 210 where string 210 starts at the current location, would be identified as an appropriate match. A detailed discussion with respect to step 814 will be discussed with respect to FIG. 8. Next, at step 816, post match identification steps are performed. These steps include, but are not limited to, a determination whether or not the string, or data block, beginning at the current location has a match size greater than or equal to a minimum match size. If not, there is no valid match and the element located at current location is stored directly to the compressed memory file and the current location is incremented by 1. This provides a new current location from which to look for matching blocks. In the event there is a valid match size from step 814 the actual compression takes place by sending to the compressed memory an escape sequence defined in step 804. For example, if the duplicate string started 8 bytes from the current location, the offset of eight would be represented by two, for a value of N equal to 4. Note, that it would also be possible for the number 2 to be represented by the value 1 since an offset of 0 would have no meaning. (i.e.. the value zero could represent an offset of one, the value one could represent and offset of 2, etc.). Once the matching data block starting at the current location is stored, the current location is incremented by the size of the largest matching string. This step assures that the new current location is the entry immediately following the data compressed. The flow of FIG. 6 ends at step 824 when the current location is within the minimum match size of the last element of data. This check is performed to determine whether or not there is data which can be compressed. If the current location is within the minimum match size of the last entry of data, there is not enough data left to compress. For example, if the minimum size of data that can be compressed is 3 bytes and the current location is 2 bytes from the end of the data file, the two remaining bytes of data cannot be compressed. When this occurs, the flow will proceed to step 824 where the final entries of the data file are stored to compressed memory. When the current location is not within the minimum size from the end, the flow proceeds to step 814 and where the largest matching string of characters for the new current location is determined.

Figure 7:
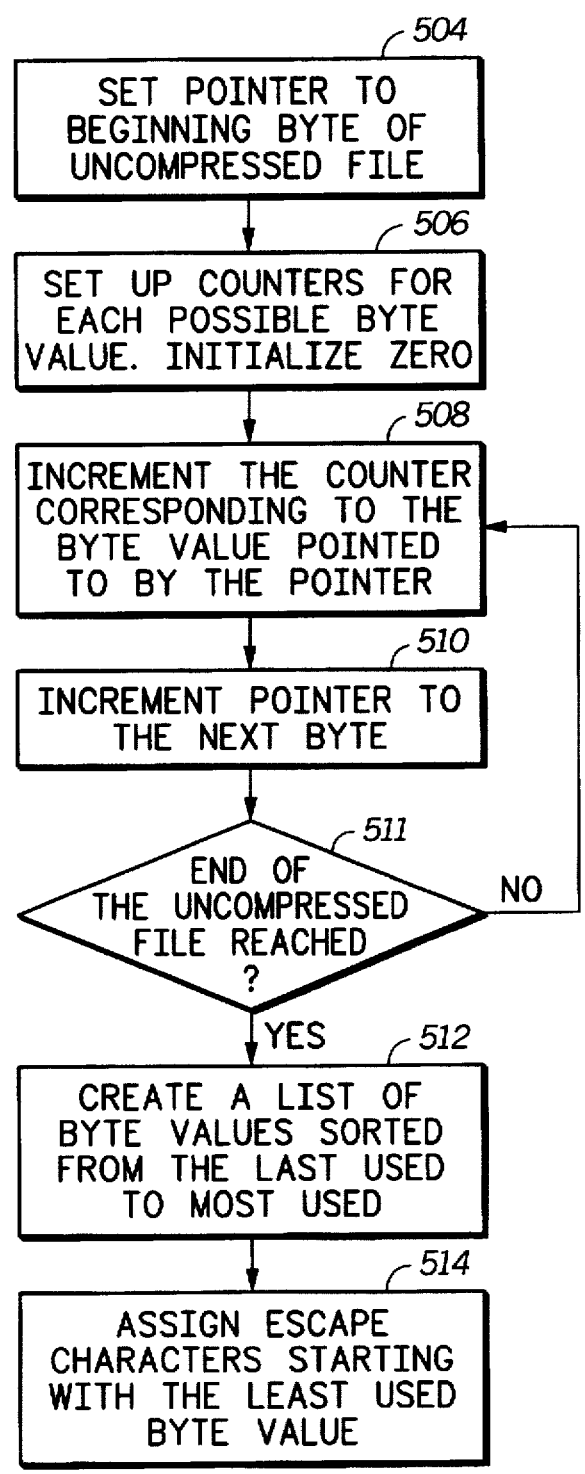
FIG. 7 represents a detailed view of flow diagram block 804 of FIG. 6.

FIG. 7 illustrates a method of implementing step 804 (FIG. 6). This step determines the least used characters in a data file. A step 504 (FIG. 7) is used to set a pointer to the beginning of the uncompressed data file. This pointer will be incremented and used to reference the value of each individual byte in the data file. Next, in step 506 counters are set up and cleared for each possible byte value. If the data file has a plurality of bit sets represented by bytes, and the bytes are 8 bits each, there would be 256 possible data values ranging from the value 0 through 257. In this example, the counters could be set up using an array of 256 locations, each initialized to zero. Next, step 508 is used to increment the specific byte counter that corresponds to the byte value referenced by the pointer. For example, if the pointer references a location with a value of 22, the byte counter for the value 22 would be incremented by 1. For example: counter[22]=counter[22]+1. Once this byte counter location is incremented, a step 510 would be used to increment the pointer to the next byte. Next, step 511 determines whether the end of the data file has been reached; this occurs when all of the data values in the data file have been counted. If the end has not been reached a branch to step 508 is taken. In the event that the end of the file has been reached, a branch is taken to step 512. Step 512 creates a sorted list of byte values. The list is sorted from the least frequently used value to the most frequently used value. Finally, a step 514 is used to assign escape characters to escape sequences of FIG. 5, starting with the least used byte value. The table of FIG. 5 lists the escape sequences and their definition. Each of the escape sequences represents either implicitly or explicitly an offset and a size for a duplicate string. The escape characters are assigned to FIG. 5 at step 514 to define escape sequences. Upon completion, the escape is written to the compressed file so that during the decompression process, the escape sequence can be identified.

Figure 8:
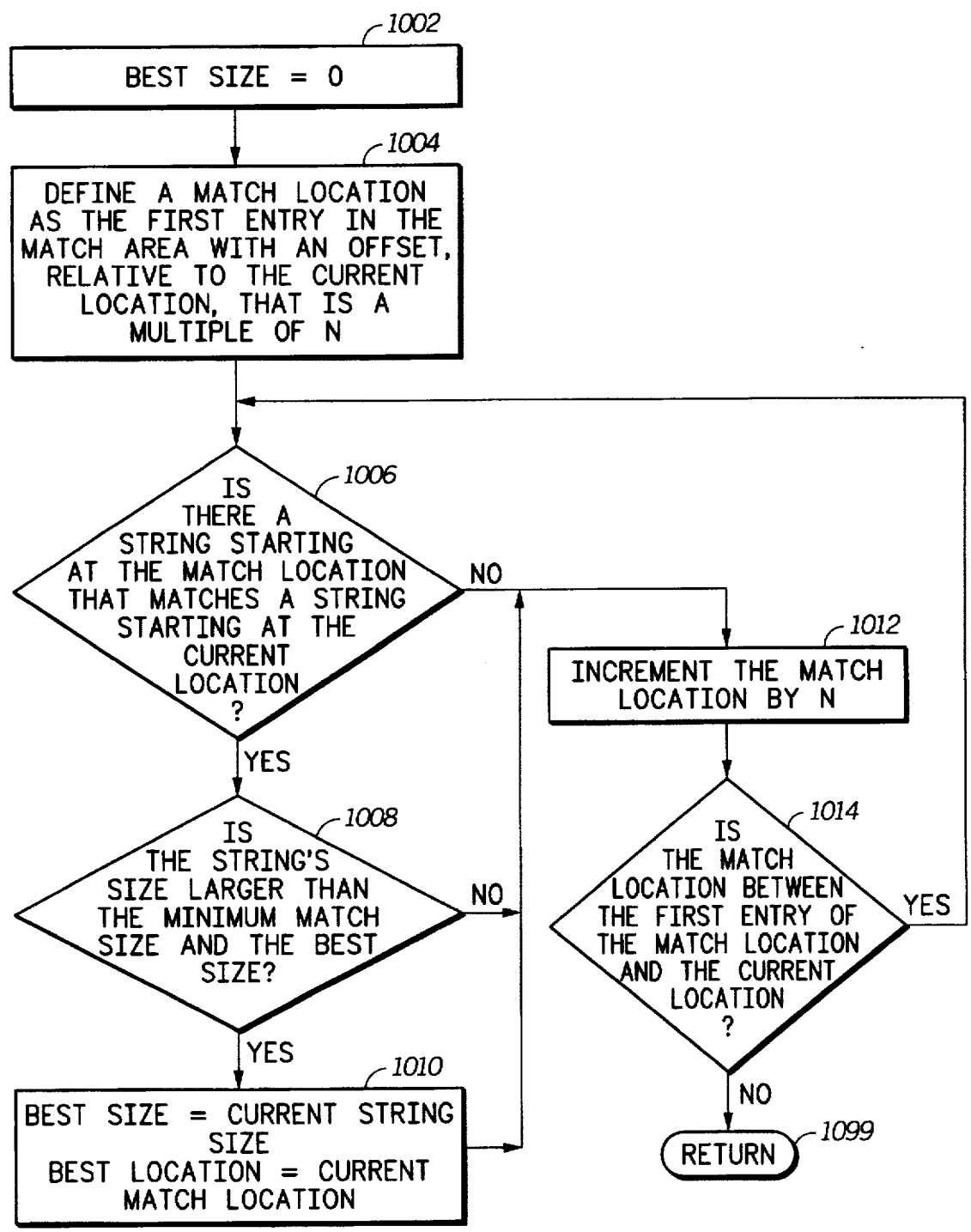
FIG. 8 represents a detailed view of flow diagram block 814 of FIG. 6.

FIG. 8 represents a detailed flow diagram of step 814 (FIG. 6). Step 814 (FIG. 6) determines the largest matching string of characters between a string starting at the current location and a string staring in the match area at an integer multiple of N from the start of the current location. FIG. 8 begins with step 1002 where best size is set equal to 0. Best size is the size of the largest matching string found for the current location. Proceeding to step 1004 a match location is defined to be the first entry in the match area with an offset, relative to the current location, having N as a factor. This step identifies the location nearest the beginning of the uncompressed data file, or the match area, where a search begins for a matching string. Next, at step 1006, a determination is made as to whether or not there is a string starting at the match location that matches a string starting at the current location. Normally this would be done by comparing a first byte at both locations. If the first byte matches, then comparing consecutive bytes at both locations. In the event that there is a string starting at the match location, flow continues at step 1008, otherwise flow continues at step 1012. At step 1008, a determination is made as to whether or not the size of the string beginning at the match location is larger than the minimum match size, and whether its size is greater than or equal to the best size. If it is less than the best size, the match is not used for compression purposes, since a larger match exists, and flow continues with step 1012, otherwise, step 1010 is used. Step 1010 defines the best size to be the size of the current match string size and the best location is defined to be the current match location. Upon completion of step 1010 flow proceeds to step 1012. At step 1012, the match location is incremented by the value of N. Next, at step 1014, it is determined whether the new match location is greater than or equal to the current location. This detects whether all possible locations in the match area have been evaluated. Therefore, if all locations have not been evaluated, the program will return to step 1006, otherwise flow will continue with step 816 of FIG. 6.

Figure 9:
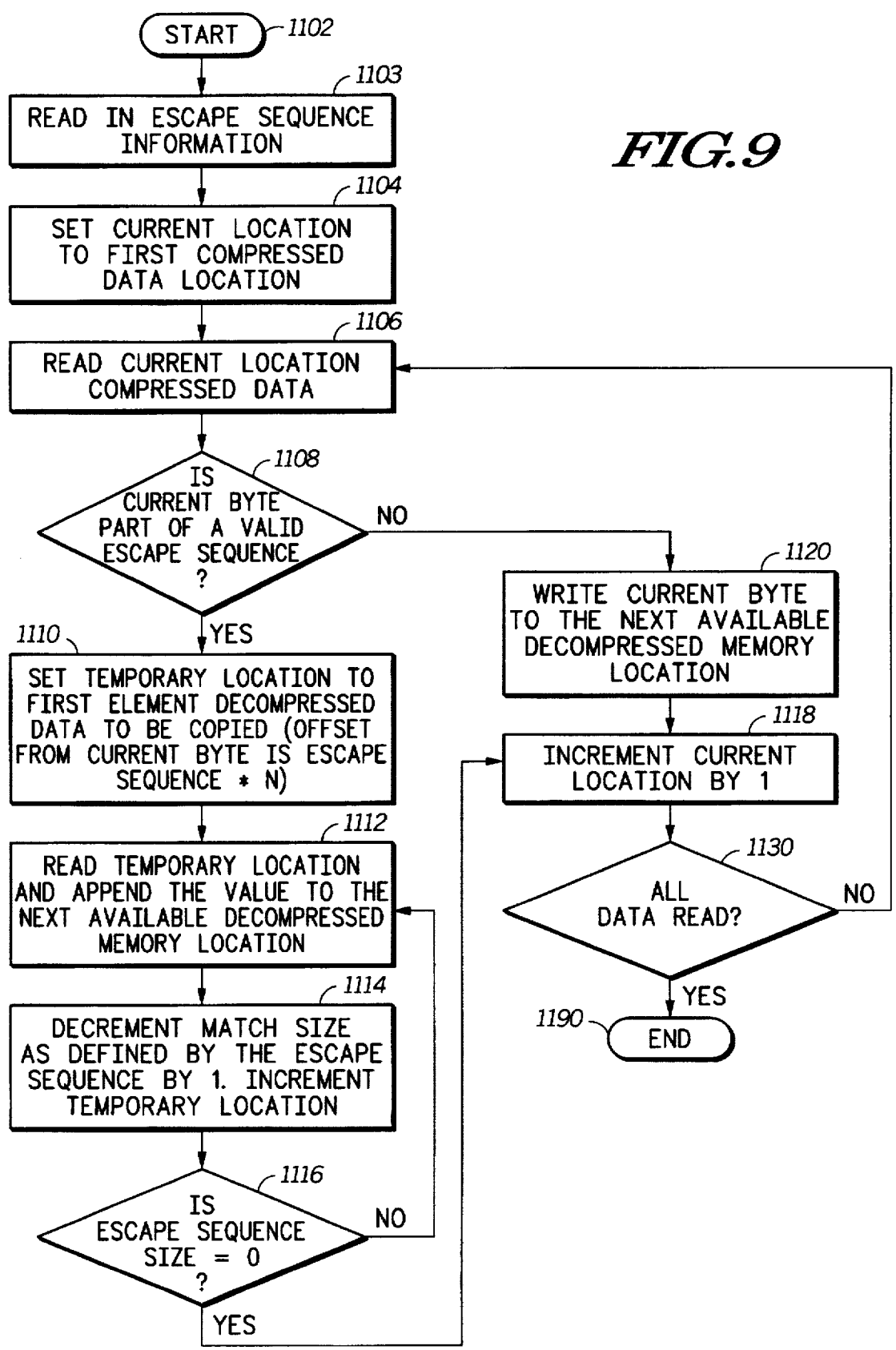
FIG. 9 illustrates a method of data decompression.

FIG. 9 illustrates the flow for a decompression program in accordance with the present invention. At step 1102, the first portion of the decompression program must have a starting step or location 1102. This is necessary because in order to decompress the data, the compressed file must contain the program and the necessary information to decompress itself. Therefore, part of the compressed file contains the decompression routine. At step 1103, the values of the escape characters and the descriptions of the escape sequences (FIG. 5) are read in. Next, at step 1104, the current location is set to the first compressed data location in the compressed file. Next, at step 1106, the data at the current location is read. Next, at step 108, a determination is made whether the current byte being evaluated at the current location is part of a valid escape sequence. If the byte is part of an escape sequence, flow proceeds to step 1110, otherwise flow proceeds at step 1120. At step 1120, the current byte is appended to the decompressed file. Flow continues at step 1118. At step 1110, a temporary location is set at the first element of the data to be copied. This location is the offset of the escape sequence times N and represents the number of bytes from the current location that the start of the matching data to be repeated is located. Next, at step 1112, the data value at the temporary location is read and appended to the decompressed file. Next, at step 1114, the match size as defined by the escape sequence is decremented by one, and the temporary location is incremented by one. Step 1116 makes a determination whether or not the escape sequence size has reached zero. In the event it has not reached zero, we are not at the end of the duplicate block of data and more data needs to be copied, therefore flow continues at step 1112, otherwise flow proceeds to step 1118. At step 1118, the current location is incremented by one. This is the current location in the compressed data file. Next at step 1130, it is decided if all of the compressed data has been evaluated. If so, the decompression flow stops at step 1199, otherwise the new current location is evaluated by returning to step 1106.

Although the invention has been described and illustrated with reference to specific embodiments, it is not intended that the invention be limited to these illustrative embodiments. For example, N may vary depending on the size of the instruction words being used. Those skilled in the art will recognize that modifications and variations can be made without departing from the spirit and scope of this invention. Therefore it is intended that this invention encompass all such variations and modifications as fall within the scope of the appended claims.

We claim:

1. A method of data compression, the method comprising the steps of:
   (a) identifying a group of data to be compressed, the group of data having a plurality of data locations, where each data location of the plurality of data locations references an individual data value and a beginning of a data block, the plurality of data locations includes a current location which references a first data block and a match location which references a second data block;
   (b) using an address generator to identify the match location, the match location having a match offset from the current location that is a multiple of N, where N is based on a repetitive characteristic of the group of data; and
   (c) determining if a match occurs between the first data block and the second data block.

2. The method of claim 1 where the current location can be any location in the group of data, and the repetitive characteristic is based on a length of a data processor instruction, where N is the length of the data processor instruction and is not equal to one.

3. The method of claim 1 further comprising:
   (d) compressing the first data block if the match occurs.

4. The method of claim 3 wherein step (d) further includes compressing the first data block by defining an escape sequence representing the match offset and a match size, where the match offset is an offset from the current location to the match location, and the match size is a number of locations in the first data block.

5. The method of claim 4 where compressing the block of data includes storing a representation of the match offset, where the match offset can be determined based on a predetermined value N by multiplying the match offset by N.

6. The method of claim 1 further comprising the step of:
   (e) determining at least one least used individual data value in the group of data to be compressed, the at least one least used individual data value to be used to identify a beginning of an escape sequence.

7. A data expansion method comprising:
   (a) performing pre data expansion steps, including loading an at least one escape sequence used to identify a compressed data to be expanded, where the at least one escape sequence begins with an escape character for identifying a beginning of the at least one escape sequence, where the at least one escape sequence represents a location of a duplicate data block and a size of the duplicate data block;
   (b) parsing a first data block containing the compressed data and identifying escape characters and their respective at least one escape sequence; and
   (c) replacing the at least one escape sequence with the duplicate data block, where a beginning of the duplicate data block begins at an offset location in a second data block, where the offset location is equal to a match offset multiplied by N, where the match offset is represented by the at least one escape sequence, and N is not equal to 1.

8. A data compression apparatus comprising:
   means for accessing a plurality of data blocks in a memory, each of the plurality of data blocks beginning at a boundary location in the memory, the plurality of data blocks includes a first data block and a second data block, the means for accessing coupled to the memory;
   means for determining if there is a match between the first data block and the second data block, where a match occurs when values represented in the first data block and the second data block are equal, the means for determining coupled to the means for accessing; and
   means for identifying a first boundary location of the first data block and a first boundary location of the second data block, each to be accessed by the means for accessing, where the first boundary location of a beginning of the first data block is offset by a multiple of N from the first boundary location of the second data block, where N represents a size of a data processor instruction and is not equal to 1, the means for identifying is coupled to the means for accessing.

9. The apparatus of claim 8 further comprising:
   means for compressing the first data block or the second data block if a match between the first data block and the second data block occurs, where the means for compressing is coupled to the means for accessing and the means for determining.

10. The apparatus of claim 9 further comprising:
   a means for determining at least one least used individual data value in the plurality of data blocks, where the at least one least used individual data value is used in the means for compressing to identify a compressed block.

11. A data expansion device comprising:
   means for identifying a valid escape sequence in a data file having a plurality of data blocks, where the valid escape sequence represents a duplicate data block to be expanded from a compressed form, and the valid escape sequence represents a match size and a match offset of the duplicate data block, the means for identifying coupled to the data file; and
   means for multiplying the match offset by a value N to locate a beginning of an already expanded duplicate data block, where N is based on a repetitive characteristic of data in the data file, the means for multiplying coupled to the means for identifying and the data file.

12. The data expansion device of claim 11 further comprising:
   means for accessing the already expanded duplicate data block, where the already expanded duplicate data block has a size equal to the match size.

13. A data compression system comprising:
   a memory unit for storing data entries where each of the data entries comprises a plurality of data blocks;
   an arithmetic address unit for providing an address used to address memory locations in the memory unit that are offset from a current location of a current data block by a multiple of N, where N is not one and represents a repetitive characteristic of the plurality of data blocks stored in the memory unit, the address unit coupled to the memory unit; and
   a data compare unit coupled to the memory unit and the address unit, for determining if a match occurs between a current data block beginning at the current location in the memory unit, and a possible match block beginning at a possible match address location in the memory unit.

14. The data compression system of claim 13 further comprising:
   a data compression block coupled to the memory unit and the data compare block for providing the possible match data block in a compressed format.

15. The system of claim 14 further comprising:
   a character occurrence block for determining at least one least used individual data value in the data entries, where the at least one least used individual data value is used in the data compression block for identify a compressed format, the character occurrence block couple to the memory unit.

16. The compressed format of claim 14 further comprising an escape sequence, the escape sequence being a representation of the possible match data block, the representation having a match offset value, where the match offset value multiplied by N identifies the possible match address location relative to the current data block, and a match size, where the match size represents a size of the possible match data block.

17. A data restoration system comprising:
   a memory having a first memory area and a second memory area, the first memory area for storing at least one data entry, and the second memory area for retrieving data;
   an escape sequence detector coupled to the memory for determining when the first memory area contains an escape sequence, the escape sequence identifying compressed data and having a match offset and a match size; and
   a duplication unit coupled to the memory and the escape sequence detector, the duplication unit identifies a matching block of data in the second memory area which is equal to the data represented by the escape sequence, the matching block of data located by multiplying the match size by N to identify an offset in the second memory area to the matching block of data, the matching block of data having a size equal to the match size.

18. The data restoration system of claim 17 where the duplication unit replaces the escape sequence with the matching block of data.

19. A data compression processor comprising:
   a central processing unit (CPU) for executing computer instructions;
   a memory coupled to the CPU for storing computer instructions and for storing data in the memory, the computer instructions comprising:
      computer instructions for identifying a group of data to be compressed, the group of data having a plurality of data locations, where each data location of the plurality of data locations references an individual data value and a beginning of a data block, the plurality of data locations includes a current location which references a first data block and a match location which references a second data block;
      computer instructions for identifying the match location, the match location having a match offset from the current location that is a multiple of N, where N is based on a repetitive characteristic of the group of data; and
      computer instructions for determining if a match occurs between the first data block and the second data block.

20. A computer readable medium (storage medium) for storing a data compression routine comprising the steps of:
   (a) identifying a group of data to be compressed, the group of data having a plurality of data locations, where each data location of the plurality of data locations references an individual data value and a beginning of a data block, the plurality of data locations includes a current location which references a first data block and a match location which references a second data block;
   (b) using an address generator to identify the match location, the match location having a match offset from the current location that is a multiple of N, where N is based on a repetitive characteristic of the group of data; and
   (c) determining if a match occurs between the first data block and the second data block.

* * * * *